US010720786B2

(12) United States Patent
Jung et al.

(10) Patent No.: US 10,720,786 B2
(45) Date of Patent: Jul. 21, 2020

(54) METHOD AND APPARATUS FOR CHARGING BATTERY

(71) Applicant: Samsung Electronics Co., Ltd., Suwon-si (KR)

(72) Inventors: Daeryong Jung, Seoul (KR); Jinho Kim, Yongin-si (KR); Myung Hoon Kim, Seoul (KR); Young Hun Sung, Hwaseong-si (KR); Duk Jin Oh, Seoul (KR); Ju Wan Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 91 days.

(21) Appl. No.: 16/163,678

(22) Filed: Oct. 18, 2018

(65) Prior Publication Data

US 2019/0123574 A1  Apr. 25, 2019

(30) Foreign Application Priority Data

Oct. 24, 2017  (KR) .......................... 10-2017-0138657

(51) Int. Cl.
*H02J 7/00* (2006.01)
*H01M 10/44* (2006.01)
(Continued)

(52) U.S. Cl.
CPC ............. *H02J 7/0071* (2020.01); *B60L 53/11* (2019.02); *B60L 53/14* (2019.02); *B60L 58/12* (2019.02);
(Continued)

(58) Field of Classification Search
CPC .. H02J 7/0071; H02J 7/00304; H02J 7/00302; G01R 31/367; B60L 53/11;
(Continued)

(56) References Cited

U.S. PATENT DOCUMENTS 5,714,866 A * 2/1998 S .......................... H02J 7/0077
320/152
8,040,106 B2  10/2011 Ishikawa
(Continued)

FOREIGN PATENT DOCUMENTS

CN  104393647 A  3/2015
JP  4805863 B2  11/2011
(Continued)

OTHER PUBLICATIONS

Extended European Search Report dated Oct. 5, 2018 in corresponding European Patent Application No. 18182809.6 (8 pages in English).

*Primary Examiner* — Phallaka Kik
(74) *Attorney, Agent, or Firm* — NSIP Law

(57) ABSTRACT

A battery charging method and apparatus are provided. The battery charging apparatus receives a desired charging time of a battery, generates charging currents of charging steps to charge the battery based on the desired charging time, acquires a charging limit condition including an internal state condition and a maximum charging time for each of the charging steps based on the desired charging time and an electrochemical model of the battery, and generates a charging profile including the charging currents and charging times of the charging currents based on the charging limit condition.

27 Claims, 16 Drawing Sheets

(51) Int. Cl.
    *B60L 53/14*     (2019.01)
    *B60L 58/12*     (2019.01)
    *G01R 31/367*     (2019.01)
    *H01M 10/0525*     (2010.01)
    *B60L 53/10*     (2019.01)

(52) U.S. Cl.
    CPC ...... *G01R 31/367* (2019.01); *H01M 10/0525* (2013.01); *H01M 10/44* (2013.01); *H02J 7/00302* (2020.01); *H02J 7/00304* (2020.01)

(58) Field of Classification Search
    CPC .... B60L 53/14; B60L 58/12; H01M 10/0525; H01M 10/44
    USPC .......................... 320/132, 133, 134, 159, 164
    See application file for complete search history.

(56) References Cited

U.S. PATENT DOCUMENTS

| | | | |
|---|---|---|---|
| 8,054,038 | B2 | 11/2011 | Kelty et al. |
| 8,117,857 | B2 | 2/2012 | Kelty et al. |
| 8,508,191 | B2 | 8/2013 | Kim et al. |
| 8,618,775 | B2 | 12/2013 | Hermann et al. |
| 8,624,560 | B2 | 1/2014 | Ungar et al. |
| 8,754,614 | B2 | 6/2014 | Paryani et al. |
| 8,961,203 | B2 | 2/2015 | Lee |
| 8,972,213 | B2 | 3/2015 | Zhang et al. |
| 9,065,292 | B2 | 6/2015 | Yazami |
| 9,153,991 | B2 | 10/2015 | Chaturvedi et al. |
| 9,331,513 | B2 | 5/2016 | Greening et al. |
| 9,728,992 | B2 | 8/2017 | Takahashi |
| 9,780,766 | B1 * | 10/2017 | Feldtkeller ............. H03K 5/135 |
| 2012/0062182 | A1 * | 3/2012 | Rimdzius ............ H02J 7/00041 320/155 |
| 2013/0119921 | A1 * | 5/2013 | Choe .................... H01M 10/48 320/106 |
| 2013/0221903 | A1 | 8/2013 | Hwang et al. |
| 2014/0239964 | A1 * | 8/2014 | Gach ...................... H02J 7/0016 324/433 |
| 2014/0361743 | A1 * | 12/2014 | Lin ...................... H02J 7/0014 320/109 |
| 2016/0006286 | A1 | 1/2016 | Khandelwal et al. |
| 2016/0146895 | A1 | 5/2016 | Yazami |
| 2016/0187428 | A1 | 6/2016 | Basu et al. |
| 2016/0261131 | A1 | 9/2016 | Childress et al. |
| 2017/0070061 | A1 | 3/2017 | Barsukov et al. |
| 2017/0104248 | A1 | 4/2017 | Lim |
| 2017/0125853 | A1 | 5/2017 | Song et al. |
| 2018/0136283 | A1 * | 5/2018 | Song ................. G01R 31/3835 |
| 2018/0198300 | A1 * | 7/2018 | Howey ................. H01M 10/42 |

FOREIGN PATENT DOCUMENTS

| | | |
|---|---|---|
| JP | 5477965 B2 | 4/2014 |
| KR | 10-2016-0119556 A | 10/2016 |
| KR | 10-1709553 B1 | 2/2017 |
| WO | WO 2011/018959 A1 | 2/2011 |
| WO | WO 2011/134861 A1 | 11/2011 |
| WO | WO 2016/100919 A1 | 6/2016 |

* cited by examiner

FIG. 4A

| Average current(A) | 2.0-2.3 | 2.3-2.6 | 2.6-2.9 | 2.9-3.3 | 3.3-3.8 | 3.8-4.4 |
|---|---|---|---|---|---|---|
| Step #1 | 3.96A | 4.29A | 4.62A | 4.95A | 5.28A | 5.61A |
| Step #2 | 3.93A | 3.96A | 4.29A | 4.62A | 4.95A | 5.28A |
| Step #3 | 3.3A | 3.93A | 3.96A | 4.29A | 4.62A | 4.95A |
| Step #4 | 2.97A | 3.3A | 3.93A | 3.96A | 4.29A | 4.62A |
| Step #5 | 2.64A | 2.97A | 3.3A | 3.93A | 3.96A | 4.29A |
| Step #6 | 2.31A | 2.64A | 2.97A | 3.3A | 3.93A | 3.96A |
| Step #7 | 1.98A | 2.31A | 2.64A | 2.97A | 3.3A | 3.93A |
| Step #8 | 1.65A | 1.98A | 2.31A | 2.64A | 2.97A | 3.3A |
| Step #9 | 1.32A | 1.65A | 1.98A | 2.31A | 2.64A | 2.97A |
| Step #10 | 0.99A | 1.32A | 1.65A | 1.98A | 2.31A | 2.64A |
| Step #11 | | 0.99A | 1.32A | 1.65A | 1.98A | 2.31A |
| Step #12 | | | 0.99A | 1.32A | 1.65A | 1.98A |
| Step #13 | | | | 0.99A | 1.32A | 1.65A |
| Step #14 | | | | | 0.99A | 1.32A |
| Step #15 | | | | | | 0.99A |

SOH #2
SOH #1 or

| Average current | Current range |
|---|---|
| $I_1$ | $A_1$ |
| $I_2$ | $A_2$ |
| ⋮ | ⋮ |

401

| Charging current (A) | Maximum charging time(min) | Maximum voltage (V) | Minimum anode overpotential (V) | Maximum anode surface lithium concentration | Minimum cathode surface lithium concentration |
|---|---|---|---|---|---|
| 3.96 | 11 | 3.85 | 0.09 | 0.82 | 0.42 |
| 3.63 | 11 | 3.9 | 0.08 | 0.84 | 0.44 |
| 3.3 | 11 | 4 | 0.07 | 0.88 | 0.4 |
| 2.97 | 11 | 4 | 0.06 | 0.88 | 0.4 |
| 2.31 | 11 | 4.1 | 0.06 | 0.9 | 0.36 |
| 1.65 | 11 | 4.16 | 0.06 | 0.92 | 0.32 |
| 1.32 | 11 | 4.18 | 0.06 | 0.94 | 0.28 |
| 0.99 | 30 | 4.19 | 0.06 | 0.95 | 0.27 |

402

| Charging current (A) | Maximum charging time(min) | Maximum voltage (V) | Minimum anode overpotential(V) | Maximum anode surface lithium concentration | Minimum cathode surface lithium concentration |
|---|---|---|---|---|---|
| 3.96 | 11 | 3.85 | 0.09 | 0.82 | 0.42 |
| 3.63 | 11 | 3.9 | 0.08 | 0.84 | 0.44 |
| 3.3 | 11 | 4 | 0.07 | 0.88 | 0.4 |
| 2.97 | 11 | 4 | 0.06 | 0.88 | 0.4 |
| 2.31 | 11 | 4.1 | 0.06 | 0.9 | 0.36 |
| 1.65 | 11 | 4.16 | 0.06 | 0.92 | 0.32 |
| 1.32 | 11 | 4.18 | 0.06 | 0.94 | 0.28 |
| 0.99 | 30 | 4.19 | 0.06 | 0.95 | 0.27 |

| Charging current (A) | Maximum charging time(min) | Maximum voltage (V) | Minimum anode overpotential(V) | Maximum anode surface lithium concentration | Minimum cathode surface lithium concentration |
|---|---|---|---|---|---|
| 3.96 | 11 | 3.85 | 0.09 | 0.82 | 0.42 |
| 3.63 | 11 | 3.9 | 0.08 | 0.84 | 0.44 |
| 3.3 | 11 | 4 | 0.07 | 0.88 | 0.4 |
| 2.97 | 11 | 4 | 0.06 | 0.88 | 0.4 |
| 2.31 | 11 | 4.1 | 0.06 | 0.9 | 0.36 |
| 1.65 | 11 | 4.16 | 0.06 | 0.92 | 0.32 |
| 1.32 | 11 | 4.18 | 0.06 | 0.94 | 0.28 |
| 0.99 | 30 | 4.19 | 0.06 | 0.95 | 0.27 |

| Charging current (A) | Maximum charging time(min) | Maximum voltage (V) | Minimum anode overpotential(V) | Maximum anode surface lithium concentration | Minimum cathode surface lithium concentration |
|---|---|---|---|---|---|
| 3.96 | 11 | 3.85 | 0.09 | 0.82 | 0.42 |
| 3.63 | 11 | 3.9 | 0.08 | 0.84 | 0.44 |
| 3.3 | 11 | 4 | 0.07 | 0.88 | 0.4 |
| 2.97 | 11 | 4 | 0.06 | 0.88 | 0.4 |
| 2.31 | 11 | 4.1 | 0.06 | 0.9 | 0.36 |
| 1.65 | 11 | 4.16 | 0.06 | 0.92 | 0.32 |
| 1.32 | 11 | 4.18 | 0.06 | 0.94 | 0.28 |
| 0.99 | 30 | 4.19 | 0.06 | 0.95 | 0.27 |

METHOD AND APPARATUS FOR CHARGING BATTERY

CROSS-REFERENCE TO RELATED APPLICATION(S)

This application claims the benefit under 35 USC § 119(a) of Korean Patent Application No. 10-2017-0138657 filed on Oct. 24, 2017, in the Korean Intellectual Property Office, the entire disclosure of which is incorporated herein by reference for all purposes.

BACKGROUND

1. Field

The following description relates to a battery charging.

2. Description of Related Art

A battery is used as a power source in a variety of devices such as, for example, a mobile device, or an electric vehicle, and various schemes of charging a battery are provided. When a constant current/constant voltage (CC/CV) charging scheme is used, charging is performed at a CV to reach a preset low current, charging is then performed at a CC to reach a voltage. Also, there are a multi-step charging scheme of performing charging at a CC in multiple steps from a high current to a low current, and a pulse charging scheme of repeatedly applying a pulse current in a short time unit.

Since a large amount of time is needed under a CV condition in the CC/CV charging scheme, the CC/CV charging scheme is not suitable for fast charging. In the multi-step charging scheme and the pulse charging scheme, a degradation of a battery occurs due to fast charging. Experience-based charging schemes regardless of an internal state of a battery have limitations in a control of degradation of the battery, and the shortening of the charging time is limited. As a number of users using an electric vehicle or mobile device including a battery increases, a demand for fast charging is increasing. Thus, there is a desire for a battery charging that provides a long life of the battery together with the capacity for fast charging the battery.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a battery charging method including receiving a desired charging time of a battery, generating, based on the desired charging time, charging currents of respective charging steps to charge the battery, acquiring a charging limit condition based on the desired charging time and an electrochemical model of the battery, the charging limit condition including at least one of an internal state condition or a maximum charging time for each of the charging steps, and generating a charging profile based on the charging limit condition, the charging profile including the charging currents and charging times of the respective charging currents.

The charging limit condition may include a condition to prevent a degradation of the battery during charging.

The internal state condition may include at least one internal state, based on the electrochemical model, that has an influence on a degradation of the battery.

The internal state condition may include any one or any combination of an anode overpotential condition, a cathode overpotential condition, an anode surface lithium ion concentration condition, a cathode surface lithium ion concentration condition, a cell voltage condition and a state of charge (SOC) condition.

The acquiring of the charging limit condition may include initializing a charging limit condition based on the charging currents, and optimizing the initialized charging limit condition to charge the battery during the desired charging time and to prevent a degradation of the battery, based on the electrochemical model and a degradation condition of the battery, and the degradation condition is a condition that causes a degradation of the battery when an internal state of the battery is substantially similar to the degradation condition.

The optimizing of the initialized charging limit condition may include estimating at least one internal state for each of the charging steps of the battery to which the charging currents are applied, based on the electrochemical model, and adjusting, based on the estimated internal state, any one or any combination of maximum charging times and internal state conditions in the initialized charging limit condition.

The optimizing of the charging limit condition may include acquiring internal state conditions in the initialized charging limit condition, and degradation conditions corresponding to the internal state conditions, generating function values from functions to which differences between the internal state conditions and the degradation conditions are input, and adjusting at least one of the internal state conditions based on a sum of the function values and the electrochemical model.

The functions may be defined so that the function values decrease in response to an increase in the differences between the internal state conditions and the degradation conditions, and the adjusting of the at least one of the internal state conditions may include adjusting the at least one of the internal state conditions based on the electrochemical model to minimize the sum during the desired charging time.

The at least one of the degradation condition or the initialized charging limit condition may be set based on a state of health (SOH) of the battery.

The battery charging method may include applying a degradation factor of the battery to the electrochemical model.

The degradation factor may include any one or any combination of an anode surface resistance, a cathode surface resistance, a reduction in an anode active material, and a reduction in a cathode active material.

The battery charging method may include estimating an state of health (SOH) of the battery, acquiring a degradation factor of the battery based on the SOH, and applying the degradation factor to the electrochemical model.

The battery charging method may include estimating at least one internal state of the battery, and generating a maximum allowable current that allows the estimated internal state to reach a limit state, in response to the battery being charged until a current SOC of the battery reaches a threshold SOC, wherein the charging currents do not exceed the maximum allowable current.

The battery charging method may include determining whether time to charge the battery is less than the desired charging time, based on the maximum allowable current and the desired charging time.

The generating of the charging currents may include generating an average charging current based on the desired charging time and a desired charging capacity of the battery, and generating a number of the charging steps and the charging currents of each of the charging steps based on the average charging current.

The generating of the charging currents and the number of the charging steps may include generating the charging currents and the number of the charging steps based on the average charging current and an SOH of the battery.

The generating of the charging currents may include generating the number of charging steps and the charging currents of the each of the charging steps based on a current range or a lookup table corresponding to the average charging current.

The generating of the charging profile may include estimating at least one internal state for each of the charging steps of the battery to which the charging currents are applied, based on the electrochemical model, and generating charging times of the charging currents based on whether the estimated internal state reaches the at least one internal state condition for the each of the charging steps in the charging limit condition.

The generating of the charging times may include determining whether a first internal state of the battery to which a first charging current of a first charging step is applied reaches a first internal state condition of the first charging step within a first maximum charging time of the first charging step, determining a first charging time of the first charging current based on a point in time at which the first internal state reaches the first internal state condition, in response to the first internal state reaching the first internal state condition, determining the first charging time of the first charging current based on the first maximum charging time, in response to the first internal state not reaching the first internal state condition, and generating charging times of the charging currents based on the first charging time and a second charging time of a second charging step subsequent to the first charging step.

The battery charging method may include charging the battery based on the charging profile, wherein the charging of the battery may include estimating a present internal state of the battery to which a present charging current of a present charging step is applied, and applying a charging current subsequent to the present charging current to the battery based on whether the estimated present internal state reaches an internal state condition of the present charging step.

In another general aspect, there is provided a battery charging method including receiving a desired charging time of a battery, generating, based on the desired charging time, charging currents of charging steps to charge the battery, acquiring a charging limit condition based on the desired charging time and an electrochemical model of the battery, the charging limit condition including an internal state condition and a maximum charging time for each of the charging steps, and charging the battery based on the charging limit condition and an internal state of the battery.

The charging of the battery may include charging the battery by applying a first charging current of a first charging step to the battery, acquiring a current, a voltage and a temperature of the battery, estimating at least one first internal state of the battery based on the acquired current, the acquired voltage and the acquired temperature, determining whether the estimated first internal state reaches a first internal state condition of the first charging step, and determining whether to charge the battery with a second charging current of a second charging step, subsequent to the first charging step, based on a result of the determining.

The charging of the battery further may include determining whether a time used to charge the battery by applying the first charging current to the battery reaches a first maximum charging time of the first charging step, and determining whether the battery is to be charged with the second charging current, based on the determining of whether the time used to charge the battery reaches the first maximum charging time.

In another general aspect, there is provided a battery charging apparatus including a processor configured to receive a desired charging time of a battery, to generate, based on the desired charging time, charging currents of respective charging steps to charge the battery, to acquire a charging limit condition based on the desired charging time and an electrochemical model of the battery, the charging limit condition including at least one of an internal state condition or a maximum charging time for each of the charging steps, and to generate a charging profile based on the charging limit condition, the charging profile including the charging currents and charging times for the respective charging currents.

In another general aspect, there is provided a battery charging apparatus including a processor configured to receive a desired charging time of a battery, to generate, based on the desired charging time, charging currents of charging steps to charge the battery, to acquire a charging limit condition based on the desired charging time and an electrochemical model of the battery, the charging limit condition including an internal state condition and a maximum charging time for each of the charging steps, and to charge the battery based on the charging limit condition and an internal state of the battery.

Other features and aspects will be apparent from the following detailed description, the drawings, and the claims.

BRIEF DESCRIPTION OF THE DRAWINGS

FIGS. 4A and 4B illustrate examples of an operation of generating a charging current and an operation of generating a charging profile based on a charging limit condition.

Figure 1:
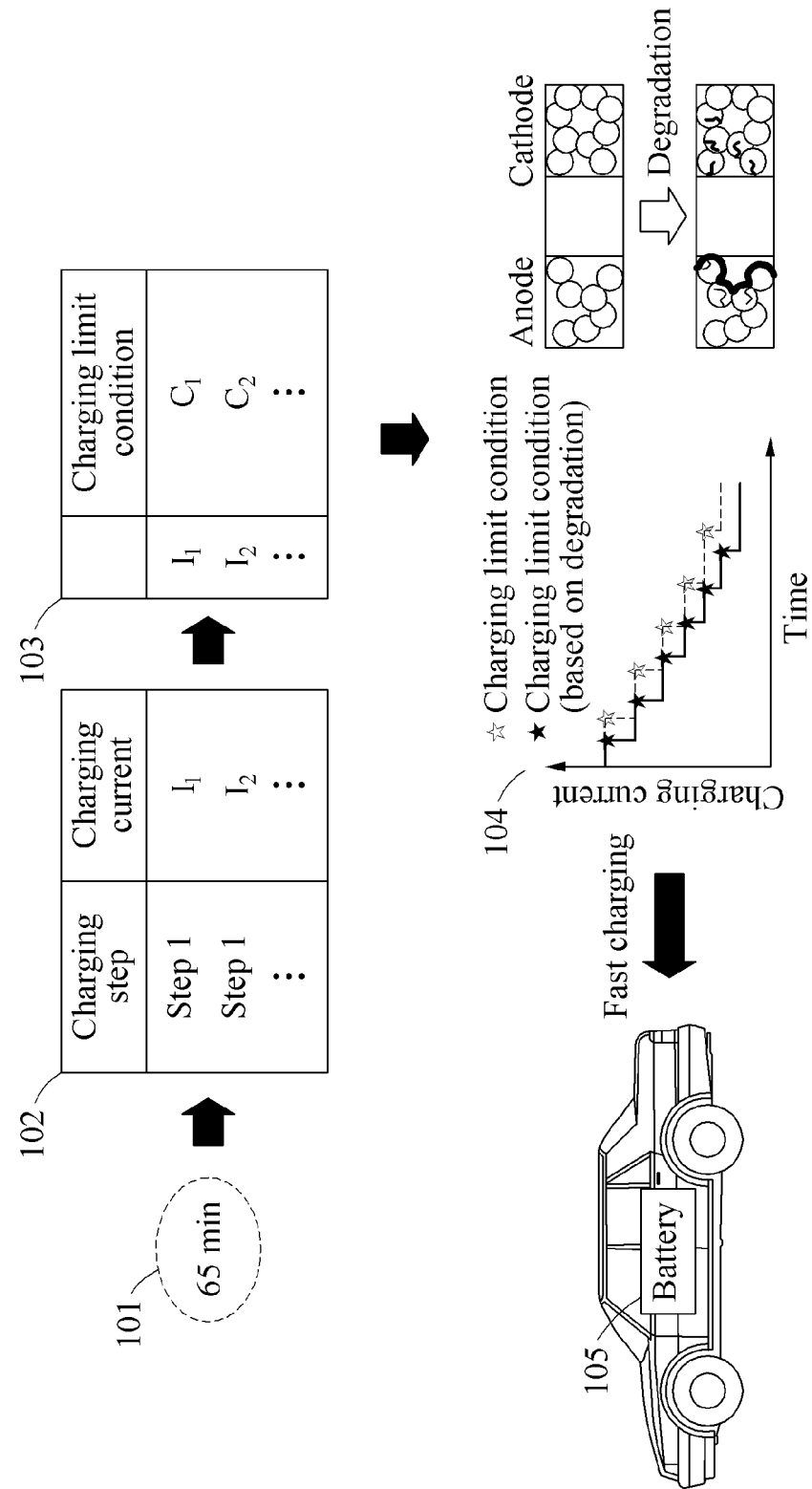
FIG. 1 illustrates an example of a battery charging method.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of functions and constructions that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or apparatuses described herein that will be apparent after an understanding of the disclosure of this application.

The following structural or functional descriptions of examples disclosed in the present disclosure are merely intended for the purpose of describing the examples and the examples may be implemented in various forms. The examples are not meant to be limited, but it is intended that various modifications, equivalents, and alternatives are also covered within the scope of the claims.

Although terms of "first" or "second" are used to explain various components, the components are not limited to such terms. These terms are used only to distinguish one component from another component. For example, a first component may be referred to as a second component, or similarly, the second component may be referred to as the first component within the scope of the right according to the concept of the following description.

It will be understood that when a component is referred to as being "connected to" another component, the component can be directly connected or coupled to the other component or intervening components may be present.

As used herein, the singular forms are intended to include the plural forms as well, unless the context clearly indicates otherwise.

Hereinafter, examples will be described in detail with reference to the accompanying drawings, and like reference numerals in the drawings refer to like elements throughout.

According to an example, a battery charging apparatus generates a charging waveform to prevent a degradation of a battery while fast charging the battery within a given charging time, based on an internal state of the battery and using an electrochemical model. In an example, the battery charging apparatus charges the battery based on the generated charging waveform. To minimize the degradation of the battery due to fast charging of the battery within a given charging time, the battery charging apparatus derives a boundary condition associated with the battery and charges the battery based on the boundary condition. In an example, the battery charging apparatus estimates an internal state of the battery based on the electrochemical model and controls charging of the battery based on the estimated internal state.

In an example, when a charging time desired by a user is input, the battery charging apparatus determines whether charging within the input charging time is possible. In an example, the battery charging apparatus derives a charging profile with an excellent battery life characteristic while satisfying the input charging time based on the estimated internal state of the battery and the boundary condition. In the following description, the given charging time is referred to as a "desired charging time," and the boundary condition is referred to as a "charging limit condition."

The desired charging time may be input or set by a user or a manager. Also, the desired charging time may be set automatically by a charging device of a battery or set in advance based on design intent. For example, a desired charging time corresponding to a fast charging mode of a battery is a time that is set in advance to complete charging, and the battery charging apparatus determines whether charging of the battery within an automatically set time is possible in response to the fast charging mode, or generates a charging profile and charges the battery. Overall description of a battery charging method will be provided below with reference to FIGS. 1 and 2. Description of a maximum allowable current will be provided below with reference to FIG. 3. Description of a charging current and a charging limit condition will be provided below with reference to FIGS. 4A and 4B. Description of an operation of optimizing a charging limit condition will be provided below with reference to FIGS. 5A, 5B and 6. Description of a charging profile reflecting a degradation of a battery will be provided below with reference to FIGS. 7A through 7D. Description of a generation of a charging profile will be provided below with reference to FIG. 8. Description of a battery charging method will be provided below with reference to FIG. 9. Description of an internal state of a battery will be provided below with reference to FIG. 10. An example of an application of a battery charging method will be described below with reference to FIG. 11, and an example of a configuration of a battery charging apparatus will be described below with reference to FIG. 12.

Figure 2:
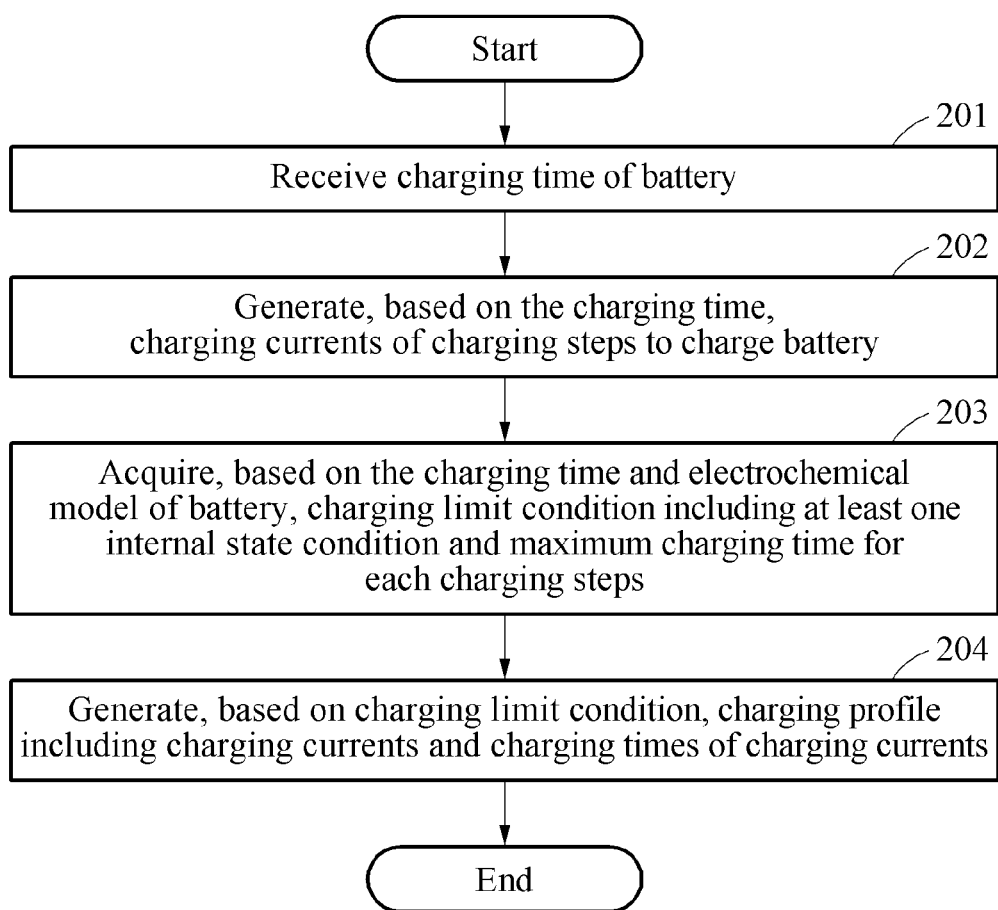
FIG. 2 is a diagram illustrating an example of a battery charging method.

FIG. 1 is a diagram illustrating an example of a battery charging method, and FIG. 2 is a diagram illustrating an example of a battery charging method. The operations in FIG. 2 may be performed in the sequence and manner as shown, although the order of some operations may be changed or some of the operations omitted without departing from the spirit and scope of the illustrative examples described. Many of the operations shown in FIG. 2 may be performed in parallel or concurrently. One or more blocks of FIG. 2, and combinations of the blocks, can be implemented by special purpose hardware-based computer that perform the specified functions, or combinations of special purpose hardware and computer instructions.

Referring to FIGS. 1 and 2, in operation 201, a battery charging apparatus receives a desired charging time 101 of a battery 105. The receiving of the desired charging time 101 includes, for example, receiving a value based on an input of a user, acquiring a value set automatically in a device, or receiving or acquiring a value from a server or memory that is located as a database (DB) inside or outside the battery charging apparatus. A DB may be implemented as a memory included in the battery charging apparatus, or an external device (not shown), for example, a server, that is connected wirelessly or via a wire or a network to the battery charging apparatus.

In an example, a user inputs an expected time to complete charging of the battery 105 using a user interface, and the battery charging apparatus receives the desired charging time 101 of the battery 105 based on the input of the user. In another example, the user inputs a command of a fast charging mode using a user interface, and the battery charging apparatus receives the desired charging time 101 corresponding to the fast charging mode.

The battery charging apparatus is an apparatus configured to charging the battery 105, and may be implemented as, for example, a hardware module. For example, the battery charging apparatus may be implemented by a battery management system (BMS). The BMS is a device that manages the battery 105, and, for example, may monitor a state of the battery 105, maintain an optimal condition for an operation of the battery 105, predict a replacement timing of the battery 105, detect a fault of the battery 105, generate a control signal or a command signal associated with the battery 105, and control the state or the operation of the battery 105.

In an example, the battery 105 includes a charger or a secondary cell configured to store power, and a device including the battery 105 may supply the power from the battery 105 to a load. The load consumes the power and may consume a power supplied from an outside. In an example, the load includes devices such as, for example, an electric heater, a light, a motor of an electric vehicle, an electronic device, which consume power using circuits in which current flow at a voltage.

In operation 202, the battery charging apparatus generates charging currents 102 of charging steps to charge the battery 105 based on the desired charging time 101. The battery charging apparatus generates the charging currents 102 and a number of the charging steps based on an internal state of the battery 105 and the desired charging time 101. Examples of charging currents will be further described below with reference to FIGS. 3, 4A, and 4B.

In operation 203, the battery charging apparatus acquires a charging limit condition 103 based on the desired charging time 101 and an electrochemical model of the battery 105. The charging limit condition 103 includes at least one internal state condition and a maximum charging time for each of the charging steps. The charging limit condition 103 is a condition that limits charging of the battery 105 during the desired charging time 101 while preventing a degradation of the battery 105. In an example, the charging limit condition 103 is defined for each of charging currents of the charging steps.

In an example, the charging limit condition 103 includes internal state conditions for each charging step. An internal state condition is defined from the electrochemical model based on at least one internal state that has an influence on the degradation of the battery 105. The internal state condition includes, for example, any one or any combination of an anode overpotential condition, a cathode overpotential condition, an anode surface lithium ion concentration condition, a cathode surface lithium ion concentration condition, a cell voltage condition, and, a state of health (SOH), a state of charge (SOC) condition of the battery 105.

The battery 105 is degraded when an internal state of the battery reaches one of internal state conditions in response to the battery 105 being charged. Accordingly, the battery charging apparatus generates a charging profile based on the internal state conditions, or controls charging of the battery 105. For example, the degradation of the battery 105 is determined to occur when an anode overpotential of the battery 105 falls below 0.05 V. An anode overpotential condition is defined as a condition that exceeds an overpotential value based on 0.05 V, and a degradation condition is a condition that causes a degradation of a battery when an internal state of the battery reaches the condition. In other words, the degradation condition is a condition that causes a degradation of a battery when an internal state of the battery is substantially similar to the degradation condition. In this example, an anode overpotential of 0.05 V is a degradation condition that causes a degradation when the anode overpotential of the battery 105 reaches 0.05V. An anode overpotential condition of the battery 105 is defined or optimized based on a degradation condition of 0.05 V and an electrochemical model. However, the internal state condition is not limited to the above examples, and various expressions that quantize an internal state having an influence on the degradation of the battery 105 may be used.

An overpotential is a voltage drop due to a deviation from an equilibrium potential associated with intercalation/de-intercalation reactions at each electrode of the battery 105. A lithium ion concentration is a concentration of lithium ions (Li+), which is used as a material in an active material of each electrode of the battery 105. In other examples, materials other than the lithium ions are used as a material in the active material.

The SOC is a parameter that indicates a charging state of the battery 105. The SOC indicates a level of energy stored in the battery 105 and an amount of SOC may be expressed as 0 to 100% using a percentage unit. For example, 0% indicates a fully discharged state and 100% indicates a fully charged state, which is variously modified and defined depending on design intent or examples. A variety of methods may be employed to estimate or measure the SOC.

In an example, the battery 105 includes an electrolyte, a separator, a collector and two electrodes (for example, an anode and a cathode). Lithium ions (Li+) are intercalated into or de-intercalated from the two electrodes. The electrolyte is a medium for movements of lithium ions ($Li^+$). The separator physically separates the cathode from the anode to prevent electrons from directly flowing and to allow ions to pass. The collector collects electrons generated by an electrochemical reaction or supplies electrons for the electrochemical reaction. Each of the cathode and the anode includes an active material. For example, lithium cobalt oxide ($LiCoO_2$) is used as an active material of the cathode, and graphite ($C_6$) is used as an active material of the anode. During charging of the battery 105, lithium ions (Li+) move from the cathode to the anode. During discharging of the battery 105, lithium ions (Li+) move from the anode to the cathode. Thus, a concentration of lithium ions (Li+) included in the active material of the cathode, and a concentration of lithium ions (Li+) included in the active material of the anode vary depending on the charging and discharging.

To express the internal state of the battery 105, an electrochemical model is employed using various schemes. For example, various application models as well as a single particle model (SPM) are employed as an electrochemical model. Also, parameters that define the electrochemical model are variously modified depending on design intent. The internal state condition is derived from the electrochemical model of the battery 105, or is experimentally or heuristically derived. A scheme of defining an internal state condition is not limited.

The charging limit condition 103 includes a maximum charging time for each of the charging steps. The maximum charging time is a condition of a maximum time to charge the battery 105 with a charging current of a corresponding charging step. As described above, the maximum charging time and internal state conditions for each of the charging steps are conditions set to achieve two purposes, i.e., a prevent a degradation of the battery 105 and a completion of charging of the battery 105 during the desired charging time 101, and are optimized by repeated adjustments. Examples of an operation of optimizing the charging limit condition 103 will be described below with reference to FIGS. 5A, 5B and 6.

In operation 204, the battery charging apparatus generates a charging profile 104 including the charging currents and charging times of the charging currents, based on the charging limit condition 103. The charging profile 104 refers to a policy that supplies current for charging.

The charging profile 104 is defined by charging currents for each of the charging steps and charging times that are times to apply corresponding charging currents. For example, the charging profile 104 is expressed by sequences of operations of charging the battery 105 with a current $I_1$ during a time $T_1$ in a step 1, charging the battery 105 with a current $I_2$ during a time $T_2$ in a step 2, and the like. In this example, a charging current is variously expressed by ampere (A) or milliampere (mA), or the charging profile 104 is defined as a sequence of C-rates for charging. A C-rate is a current characteristic of a battery indicating a rate of current for charging and discharging of the battery based on a capacity of the battery, and a unit of "C" is used. For example, when a battery has a capacity of 1,000 milliampere hour (mAh) that is an amount of current to be used for 1 hour, and when current for charging and discharging is 1 A, the c-rate is represented by "1 C=1 A/1,000 mAh."

The battery charging apparatus generates the charging profile 104 that reflects a degradation level of the battery 105. For example, a degradation factor of the battery 105 is applied to an electrochemical model that is utilized to estimate an initial state of the battery 105, to acquire a charging limit condition or to generate a charging profile. The degradation factor of the battery 105 is a factor indicating the degradation level of the battery 105, and includes any one or any combination of an anode surface resistance, a cathode surface resistance, a reduction in an anode active material, and a reduction in a cathode active material.

The battery charging apparatus estimates a state of health (SOH) of the battery 105, acquires the degradation factor of the battery 105 based on the estimated SOH, and applies the acquired degradation factor to an electrochemical model. The SOH is a parameter that quantitatively represents a change in a life characteristic of the battery 105 due to an aging effect (for example, a degradation phenomenon), and indicates a degree by which a life or capacity of the battery 105 is degraded. Various schemes of estimating or measuring an SOH are employed. In an example, parameters of the electrochemical model are modified when the degradation level of the battery 105 is reflected.

The degradation level of the battery 105 is reflected in one of the functions or variables utilized to optimize not only the electrochemical model, but also the charging currents 102 and the charging limit condition 103, and functions or variables used to optimize the charging limit condition 103. In an example, the battery charging apparatus acquires the charging limit condition 103 reflecting the degradation level of the battery 105, and generates the charging profile 104 based on the charging limit condition 103 reflecting the degradation level of the battery 105. For example, when the degradation level of the battery 105 is reflected, a charging profile is modified. The battery charging apparatus acquires the charging limit condition 103 to charge the battery 105 during the desired charging time 101 while preventing the degradation of the battery 105, and generates the charging profile 104 reflecting the degradation level of the battery 105. Thus, the battery charging apparatus generates the charging profile 104 to prevent degradation of the battery 105 and a completion of charging of the battery 105 within the desired charging time 101, based on the degradation level of the battery 105. Examples of a charging profile will be further described below with reference to FIGS. 7A through 7D and 8.

Figure 3:
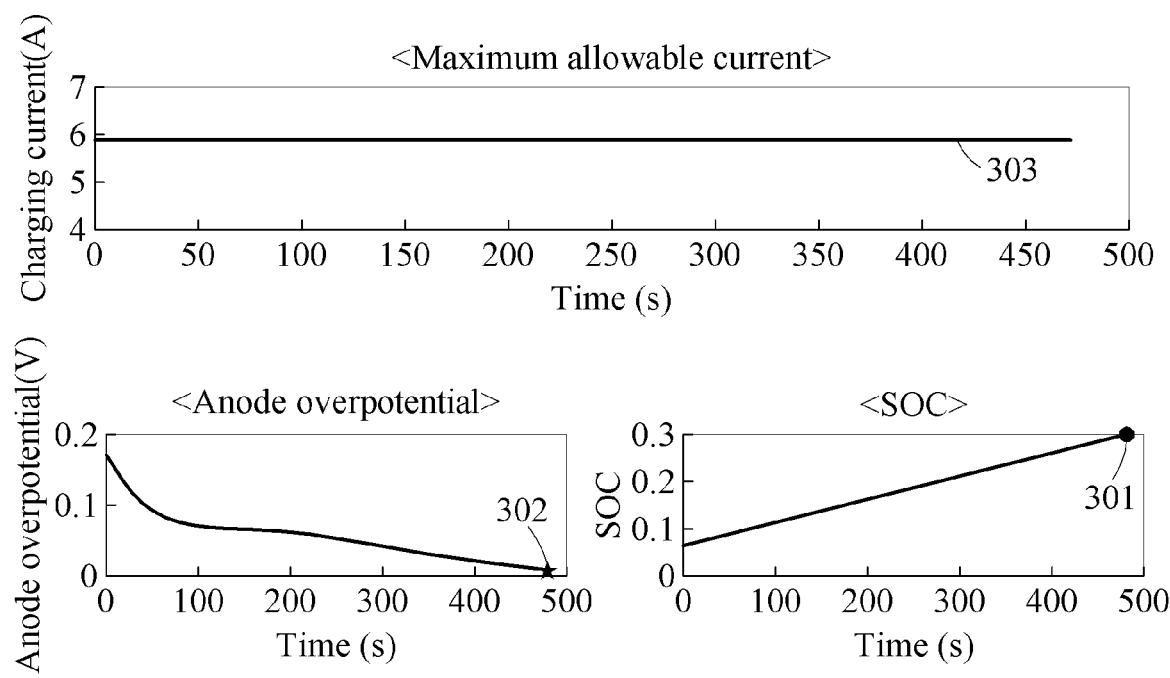
FIG. 3 illustrates an example of an operation of generating a maximum allowable current.

FIG. 3 illustrates an example of an operation of generating a maximum allowable current.

In an example, a battery charging apparatus generates a maximum allowable current, and generates charging currents of a charging profile based on the maximum allowable current. For example, the battery charging apparatus generates charging currents so that the maximum allowable current is not exceeded.

In an example, the battery charging apparatus estimates an internal state of a battery using an electrochemical model. When the battery is charged until a current SOC of the battery reaches a threshold SOC, the battery charging apparatus generates a maximum allowable current that allows an estimated internal state to reach a limit state. For example, when the battery is charged to reach a threshold SOC, the battery charging apparatus calculates a maximum allowable current that allows a cathode overpotential, an anode overpotential, a cathode lithium ion concentration, or an anode lithium ion concentration of the battery to reach a limit value. Referring to FIG. 3, in an example, when the battery is charged until an SOC of the battery reaches a 30% SOC 301, the battery charging apparatus calculates, as a maximum allowable current, a current 303 of 5.94 A corresponding to 1.8 C that allows an anode overpotential to reach an anode overpotential 302 of 0.01 V. The battery charging apparatus calculates a maximum allowable current based on a degradation level of the battery. For example, a SOC and a limit state are adjusted based on the degradation level of the battery, and the battery charging apparatus estimates a state of the battery using an electrochemical model to which a degradation factor of the battery is applied, and generates a maximum allowable current based on the estimated state.

The battery charging apparatus determines whether charging of the battery within a desired charging time is possible, based on the maximum allowable current and the desired charging time. When the charging is determined to be possible, the battery charging apparatus generates a charging profile for charging of the battery.

Figure 4B:
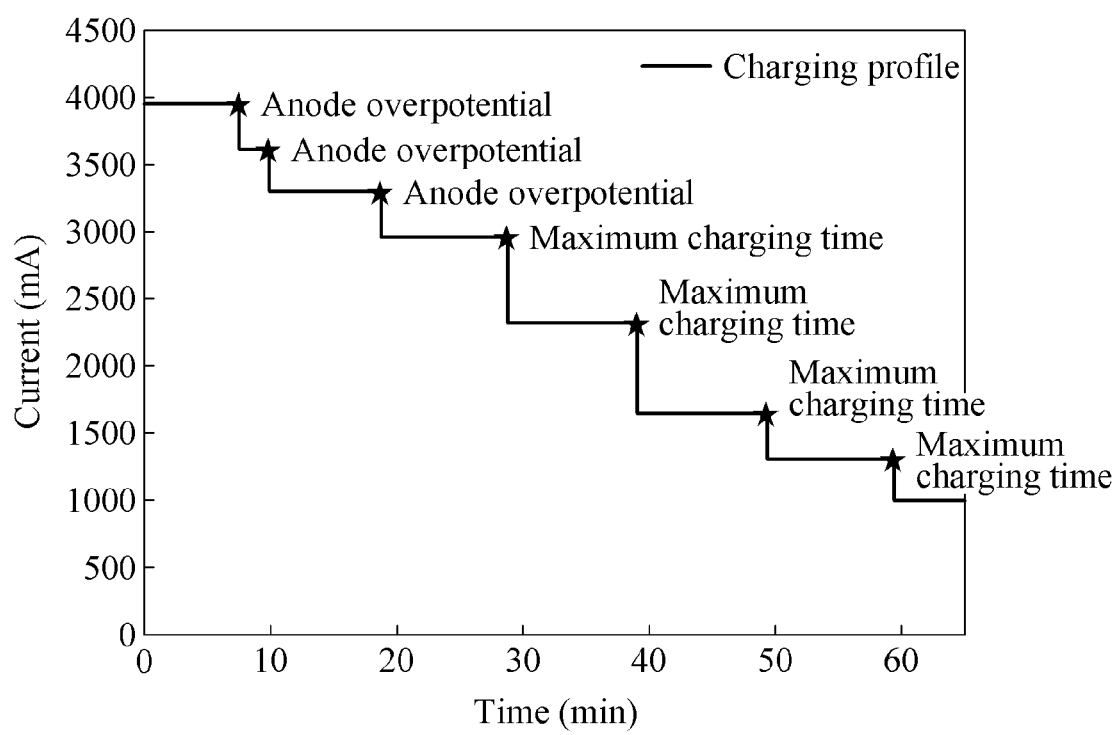

FIGS. 4A and 4B illustrate an example of an operation of generating a charging current and an operation of generating a charging profile based on a charging limit condition.

A battery charging apparatus generates an average charging current based on a desired charging capacity and a desired charging time. For example, the battery charging apparatus estimates a current SOC of a battery, and calculates a desired charging capacity based on the estimated current SOC and an SOC (for example, 100% indicating a fully charged state) by a completion of charging. The battery charging apparatus generates an average charging current using Equation 1 shown below.

Average charging current (A)=Desired charging capacity (Ah)/Desired charging time (h)    [Equation 1]

The battery charging apparatus generates a number of charging steps and charging currents of each of the charging steps, based on the average charging current. Referring to FIG. 4A, the battery charging apparatus generates, based on a lookup table for each average charging current or a current range for each average charging current, a number of charging steps and charging currents of the charging steps. In an example, the battery charging apparatus uses an SOH of the battery to generate a number of charging steps and charging currents of the charging steps.

When a generated average charging current ranges from 2.0 A to 2.3 A and when an estimated SOH corresponds to SOH #1, the battery charging apparatus generates charging currents 401 from the lookup table. Referring to FIG. 4A, average charging currents and charging currents for each of charging steps corresponding to SOHs are defined in the lookup table, and the battery charging apparatus generates charging currents based on a average charging current and a threshold SOH. Various schemes are used in an example of a lookup table formed for each average charging current, depending on design intent.

The battery charging apparatus acquires a charging limit condition 402 based on the charging currents 401. The charging limit condition 402 is defined based on an internal state of a battery estimated based on an electrochemical model, and is optimized by adjusting any one or any combination of maximum charging times and internal state conditions as described above. Also, a degradation factor is applied to the electrochemical model.

Referring to FIG. 4B, the battery charging apparatus generates a charging profile based on the acquired charging limit condition 402. The battery charging apparatus estimates at least one internal state for each of charging steps of a battery to which the charging currents 401 are applied, based on the electrochemical model. The battery charging apparatus generates charging times of charging currents based on whether the estimated internal state reaches at least one internal state condition for each of the charging steps in the charging limit condition 402. In the charging profile of FIG. 4B, a first charging step in which the battery is charged with a first charging current is changed to a second charging step at a point in time at which a charging time of the battery reaches a maximum charging time or at which an internal state of the battery reaches one of internal state conditions in the first charging step.

Figure 5A:
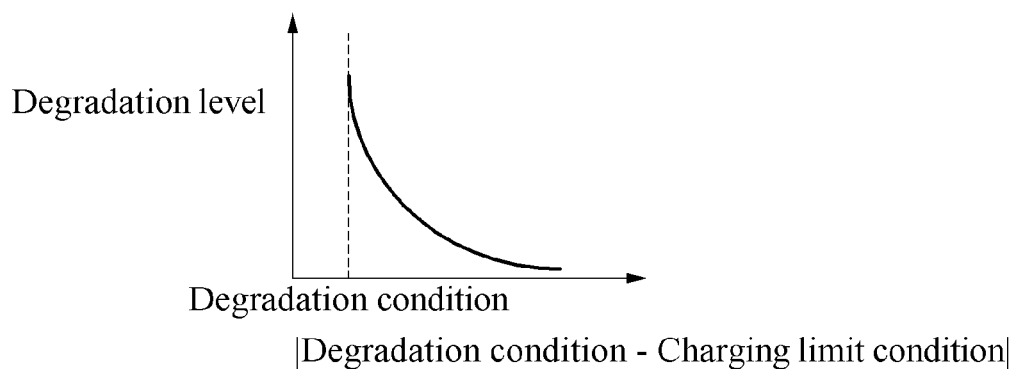
FIGS. 5A and 5B illustrate examples of an operation of optimizing a charging limit condition.
Figure 5B:
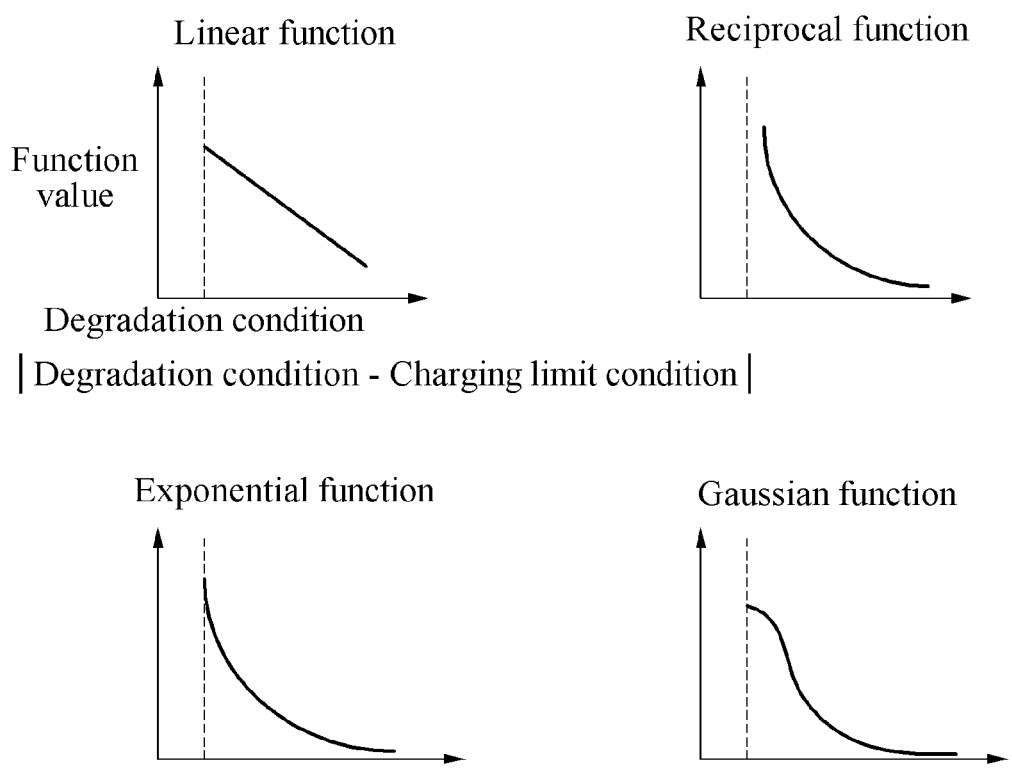

FIGS. 5A and 5B illustrate an example of an operation of optimizing a charging limit condition.

A battery charging apparatus optimizes an initialized charging limit condition based on an electrochemical model and a degradation condition of a battery. As described above, the battery charging apparatus generates charging currents of charging steps to charge the battery, and initializes a charging limit condition based on the generated charging currents. For example, the battery charging apparatus acquires a charging limit condition from lookup tables corresponding to SOHs and average currents.

The battery charging apparatus optimizes the initialized charging limit condition, to charge the battery during a desired charging time while preventing a degradation of the battery, based on the degradation condition and the electrochemical model. As described above, the degradation condition is a condition that causes a degradation of the battery when an internal state of the battery reaches the condition, such as, for example, a theoretical value or an experimental value defined based on the electrochemical model.

The battery charging apparatus estimates at least one internal state for each of charging steps of a battery to which charging currents are applied, based on the electrochemical model. In an example, the battery charging apparatus adjusts any one or any combination of maximum charging times and internal state conditions in the initialized charging limit condition based on the estimated internal state. In an example, the battery charging apparatus utilizes the degradation condition to adjust any one or any combination of the internal state conditions and the maximum charging times.

The battery charging apparatus acquires internal state conditions in the initialized charging limit condition and degradation conditions corresponding to the internal state conditions. The battery charging apparatus generates function values from functions to which differences between initialized internal state conditions and the acquired degradation conditions are input. For example, the battery charging apparatus acquires a first function in which a first function value is generated from a difference between a minimum anode overpotential and a degradation condition corresponding to the minimum anode overpotential, acquires a second function in which a second function value is generated from a difference between a maximum anode surface lithium ion concentration and a degradation condition corresponding to the maximum anode surface lithium ion concentration, and acquires functions corresponding to the other internal state conditions. The battery charging apparatus generates functions values from the acquired functions.

Referring to FIG. 5A, a function is defined so that a function value decreases as a difference between a degradation condition and a charging limit condition increases. Functions corresponding to the internal state conditions are defined so that function values decrease as the differences between the internal state conditions and the degradation conditions increase. Referring to FIG. 5B, a function for an optimization of the charging limit condition includes, for example, a linear function, a reciprocal function, an exponential function and a Gaussian function as well as an inverse proportion function. The function for the optimization of the charging limit condition is not limited to the above functions of FIG. 5B, and is variously applicable.

The battery charging apparatus adjusts at least one of the internal state conditions based on the electrochemical model so that a sum of function values of the functions corresponding to the internal state conditions in a condition that the battery is charged during a desired charging time is minimized. For example, the battery charging apparatus adjusts at least one of the maximum charging times in the charging limit condition so that a degradation of the battery is minimized in a condition that the battery is charged during a desired charging time. The battery charging apparatus adjusts any one or any combination of the internal state conditions and the maximum charging times in the charging limit condition based on a degradation level of the battery. At least one of the above-described degradation condition and the initialized charging limit condition is set based on an SOH of the battery, and the battery charging apparatus optimizes the charging limit condition using an electrochemical model to which a degradation factor based on the SOH is applied. The battery charging apparatus optimizes the charging limit condition by repeatedly adjusting any one or any combination of the internal state conditions and the maximum charging times in the charging limit condition.

Figure 6:
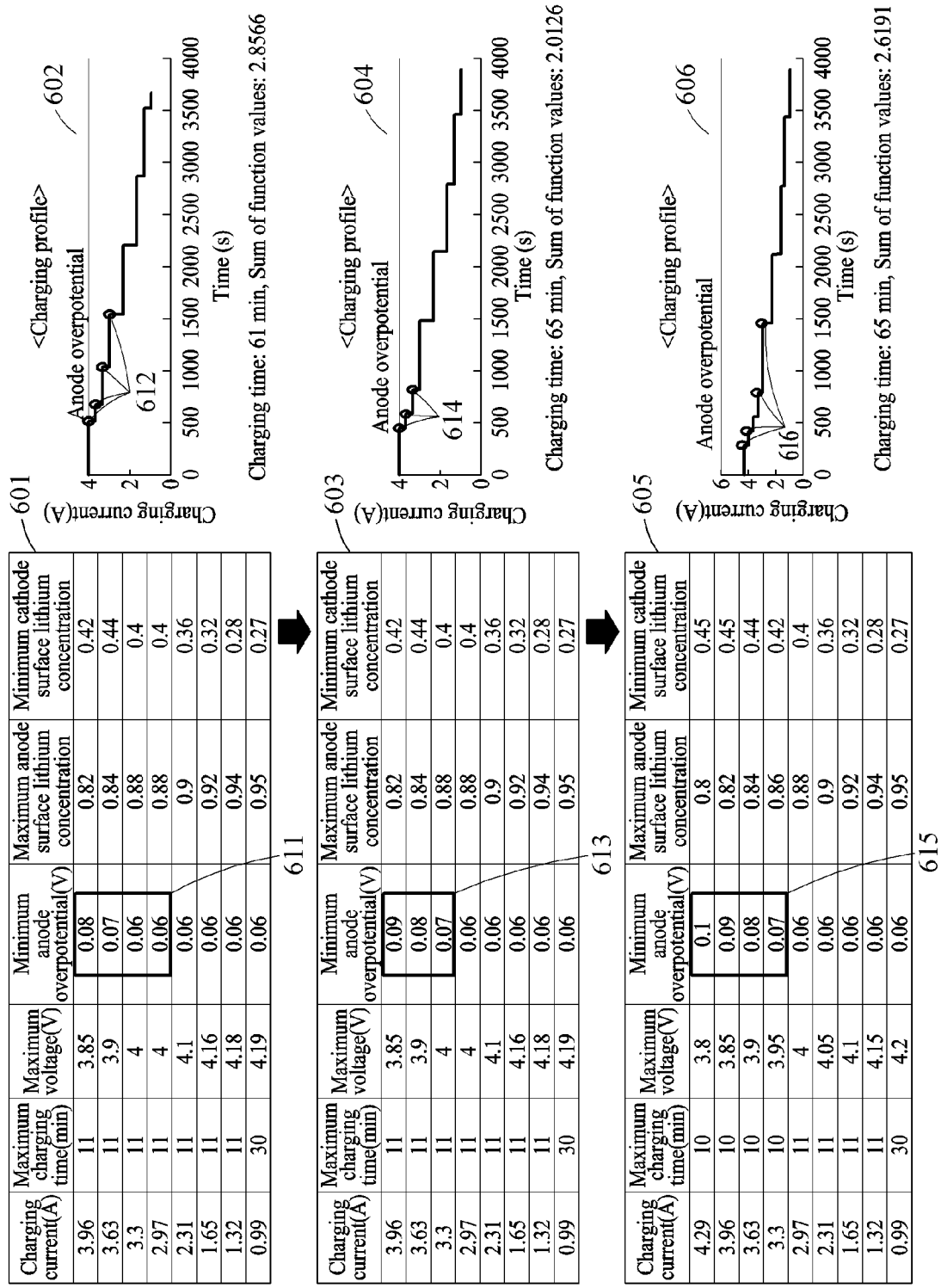
FIG. 6 illustrates an example of an operation of optimizing a charging limit condition.

FIG. 6 illustrates another example of an operation of optimizing a charging limit condition.

A battery charging apparatus estimates a charging time based on a charging profile. The battery charging apparatus repeatedly adjusts a charging limit condition based on a sum of the above-described function values and a comparison result of an estimated charging time and a desired charging time, and optimizes the charging limit condition.

Referring to FIG. 6, in an example, the battery charging apparatus adjusts internal state conditions 611 in a charging limit condition 601, and generates a charging profile 602 based on charging times 612 that reach the internal state conditions 611. In an example, the battery charging apparatus adjusts internal state conditions 613 in a charging limit condition 603, and generates a charging profile 604 based on charging times 614 that reach the internal state conditions 613. In an example, the battery charging apparatus adjusts internal state conditions 615 in a charging limit condition 605, and generates a charging profile 606 based on charging times 616 that reach the internal state conditions 615. In an example, the battery charging apparatus derives the charging profiles 602, 604 and 606 in a process of optimizing a charging limit condition, and optimizes a charging limit condition based on sums of function values and charging times corresponding to each of the charging profiles 602, 604 and 606. For example, the battery charging apparatus determines, as an optimized charging limit condition, the charging limit condition 603 corresponding to the charging profile 604 in which a charging time is 65 minutes and a sum of function values is 2.0126.

The battery charging apparatus generates a charging profile from the optimized charging limit condition and charges a battery based on the generated charging profile. The battery charging apparatus estimates a state of the battery while charging the battery, compares the estimated state and the optimized charging limit condition, and generates a charging profile.

FIGS. 7A through 7D illustrate examples of an operation of generating a charging profile reflecting a degradation of a battery.

Figure 7A:
FIGS. 7A through 7D illustrate examples of an operation of generating a charging profile reflecting a degradation of a battery.
Figure 7A:
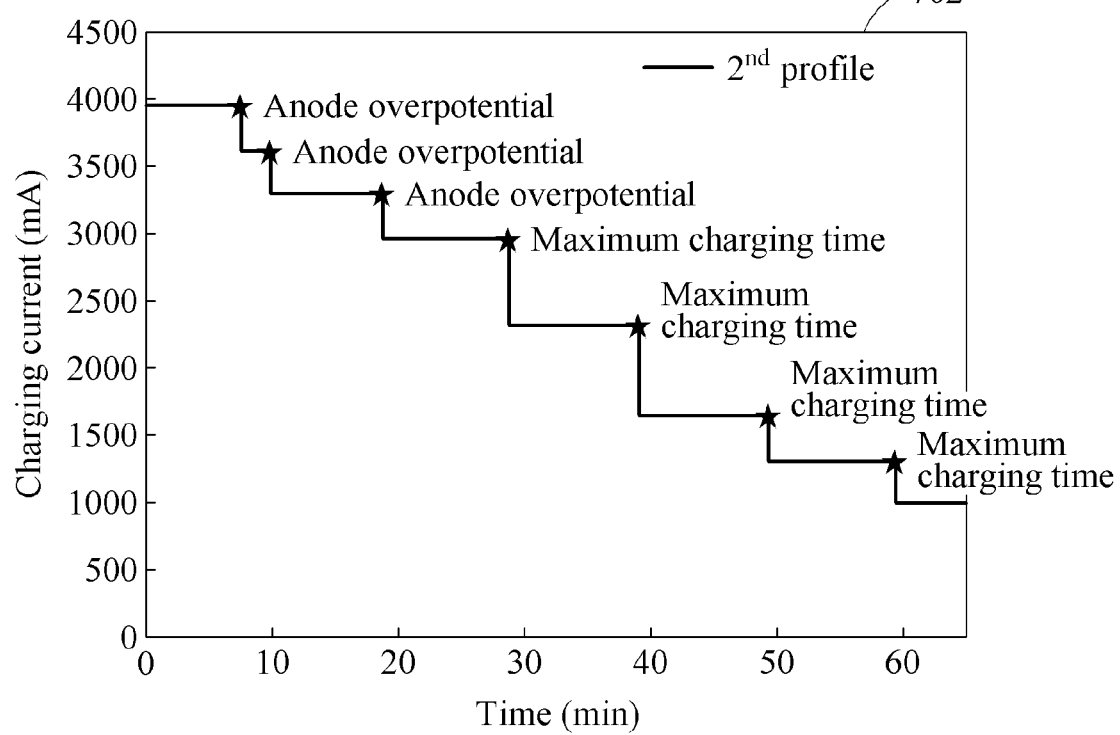
Figure 7B:
Figure 7B:
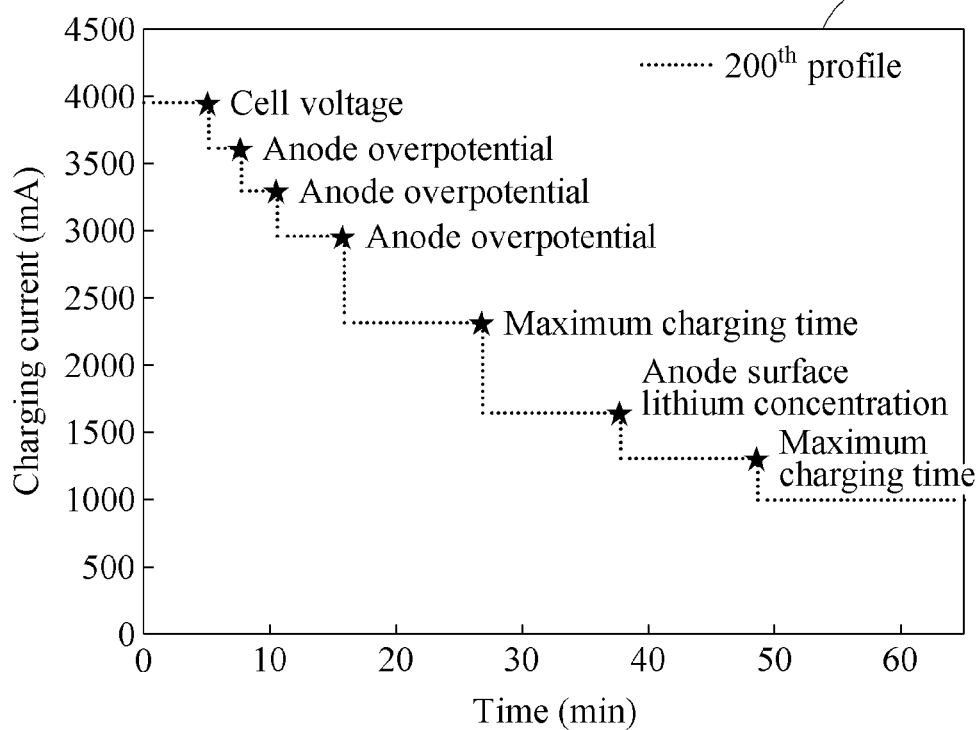
Figure 7C:
Figure 7C:
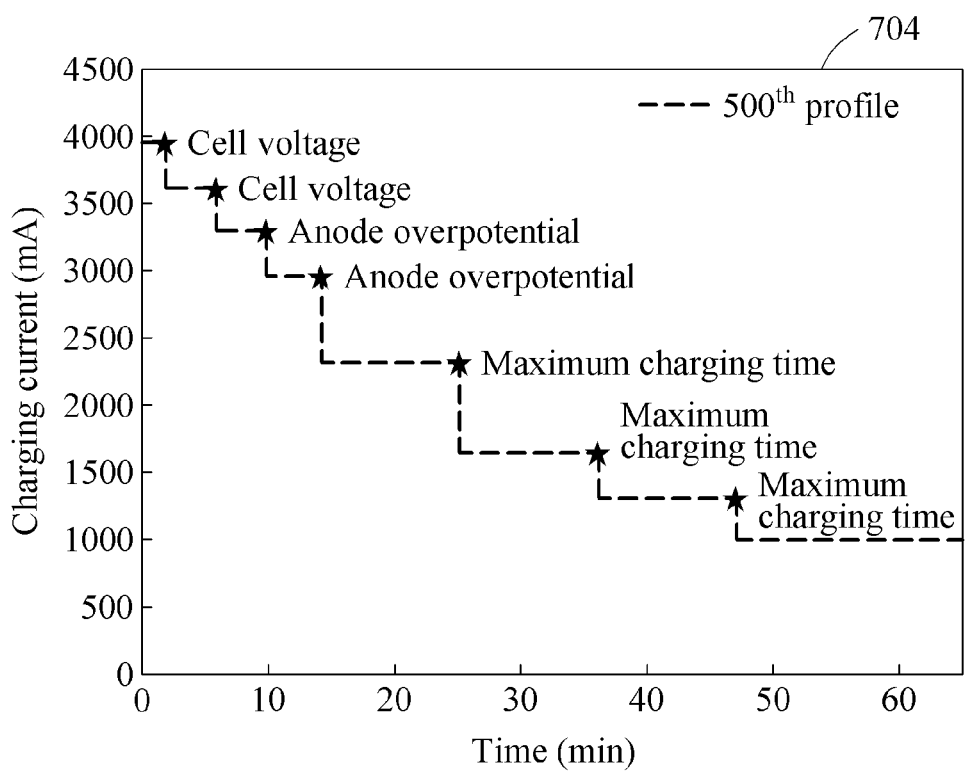
Figure 7D:
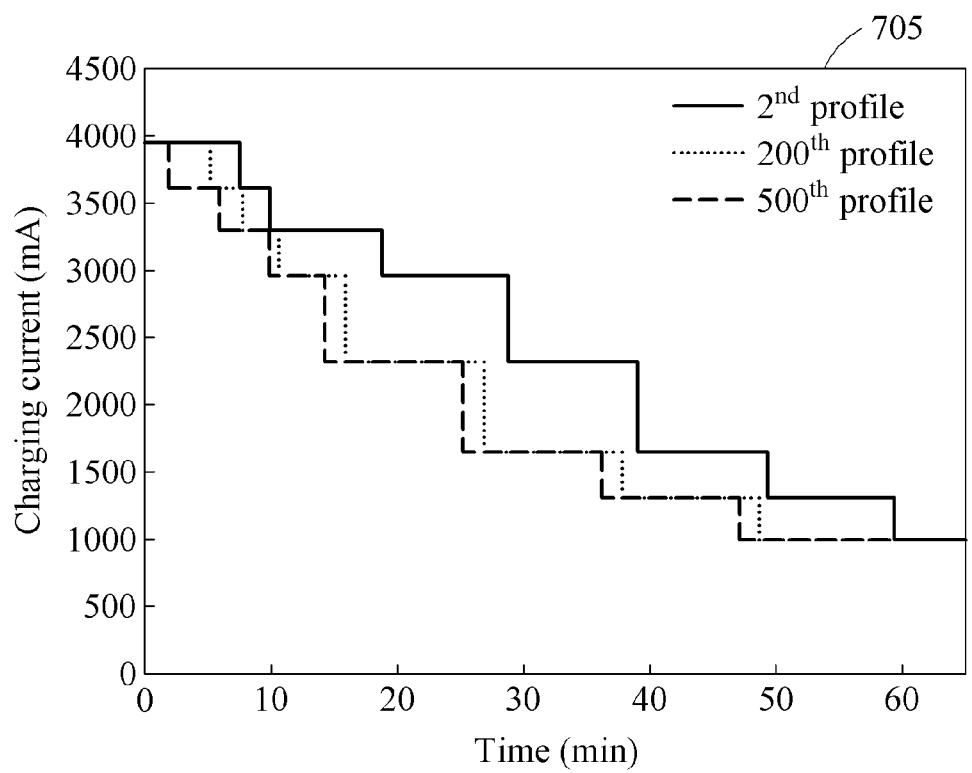

A battery charging apparatus generates a charging profile based on a charging limit condition and a degradation level of a battery. Referring to FIGS. 7A through 7C, the battery charging apparatus generates a $2^{nd}$ charging profile 702, a $200^{th}$ charging profile 703 and a $500^{th}$ charging profile 704 that correspond to a charging limit condition 701. Although the same charging limit condition, i.e., the charging limit condition 701 is used, different charging profiles, i.e., the $2^{nd}$ charging profile 702 through the $500^{th}$ charging profile 704 are generated based on a number of times the battery is charged. The battery charging apparatus generates the $2^{nd}$ charging profile 702 based on the charging limit condition 701, generates the $200^{th}$ charging profile 703 based on the charging limit condition 701, and generates the $500^{th}$ charging profile 704 based on the charging limit condition 701. Referring to FIG. 7D, different charging profiles 705 are generated based on a number of times the battery is charged. When the number of times the battery is charged increases, the degradation level of the battery increases. The degradation level of the battery is expressed by, for example, an SOH. The battery charging apparatus estimates a state of the battery from an electrochemical model to which a degradation factor is applied, and generates the different charging profiles 705 based on the number of times the battery is charged, from the estimated state and the charging limit condition 701.

Although different charging profiles corresponding to a charging limit condition are generated based on the degradation level (for example, the number of times the battery is charged) of the battery as described above, the battery charging apparatus defines different charging limit conditions based on the degradation level of the battery, optimizes a charging limit condition corresponding to a degradation level using an electrochemical model to which a degradation factor of the battery is applied, and generates a charging profile from the optimized charging limit condition.

Figure 8:
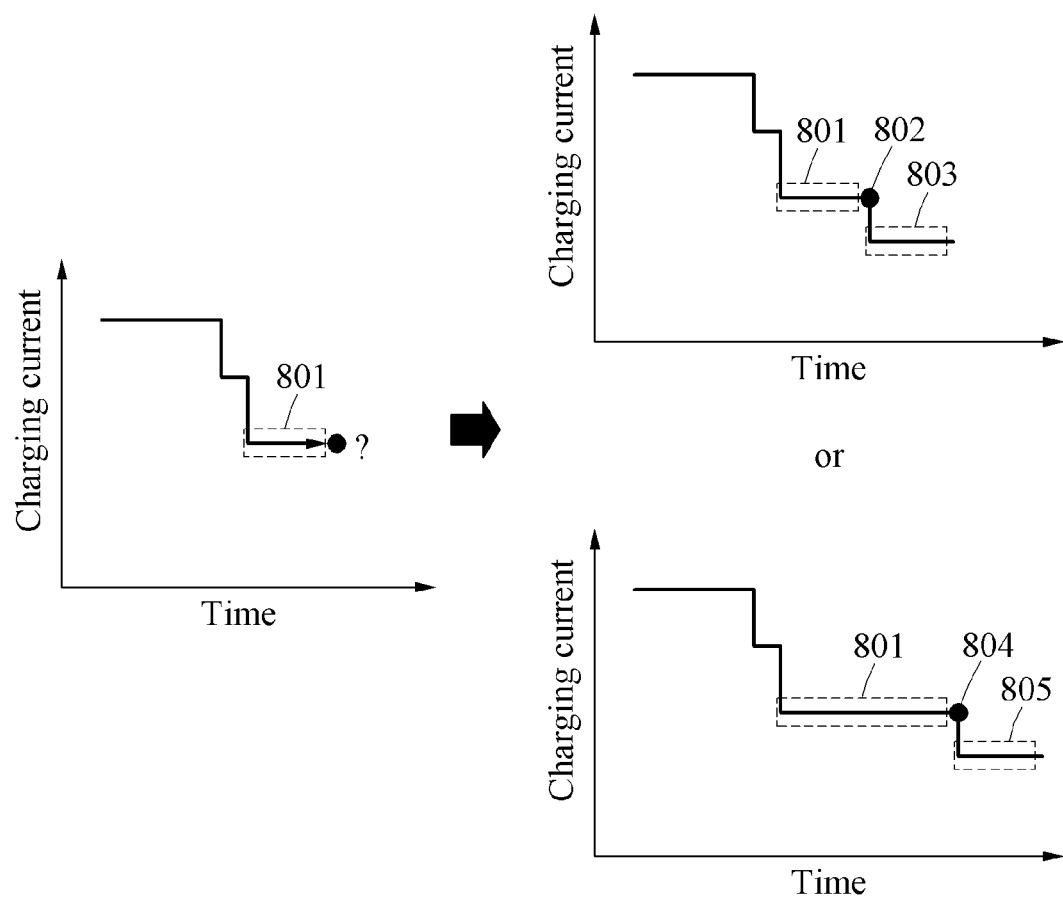
FIG. 8 illustrates an example of an operation of generating a charging profile.

FIG. 8 illustrates an example of an operation of generating a charging profile.

A battery charging apparatus estimates an internal state of a battery in a charging step. The battery charging apparatus generates a charging time of a charging current in the charging step, based on whether the estimated internal state reaches one of internal state conditions of the charging step.

Referring to FIG. 8, the battery charging apparatus determines whether a first internal state of a battery to which a first charging current 801 of a first charging step is applied reaches a first internal state condition of the first charging step within a first maximum charging time of the first charging step.

In an example, when the first internal state reaches the first internal state condition, the battery charging apparatus determines a first charging time of the first charging current 801 based on a point 802 in time, which is the time at which the first internal state reaches the first internal state condition. The battery charging apparatus generates a charging profile so that a second charging current 803 of a second charging step is applied to the battery after the point 802 in time.

In another example, when the first internal state does not reach the first internal state condition, the battery charging apparatus determines the first charging time of the first charging current 801 based on a point 804 in time at which a charging time of the first charging current 801 reaches the first maximum charging time. The battery charging apparatus generates a charging profile so that a second charging current 805 of a second charging step is applied to the battery after the point 804 in time. Also, the battery charging apparatus generates charging times for each charging steps based on a state of the battery estimated from an electrochemical model, and generates a charging profile based on the generated charging times.

The battery charging apparatus charges the battery based on the generated charging profile, estimates the state of the battery during charging of the battery, compares the estimated state to a charging limit condition corresponding to the charging profile, and adjusts the charging profile. The battery charging apparatus estimates, from an electrochemical model, a present internal state of the battery to which a present charging current of a present charging step is applied. The battery charging apparatus applies the present charging current to the battery during a maximum charging time or applies a charging current next to the present charging current to the battery, based on whether the estimated present internal state reaches the internal state condition of the present charging step.

The battery charging apparatus acquires a charging limit condition based on a desired charging time and an electrochemical model of the battery, and charges the battery based on the acquired charging limit condition. The battery charging apparatus estimates a state of the battery and charges the battery based on the estimated state and the charging limit condition. During the charging of the battery, a charging profile is generated.

Figure 9:
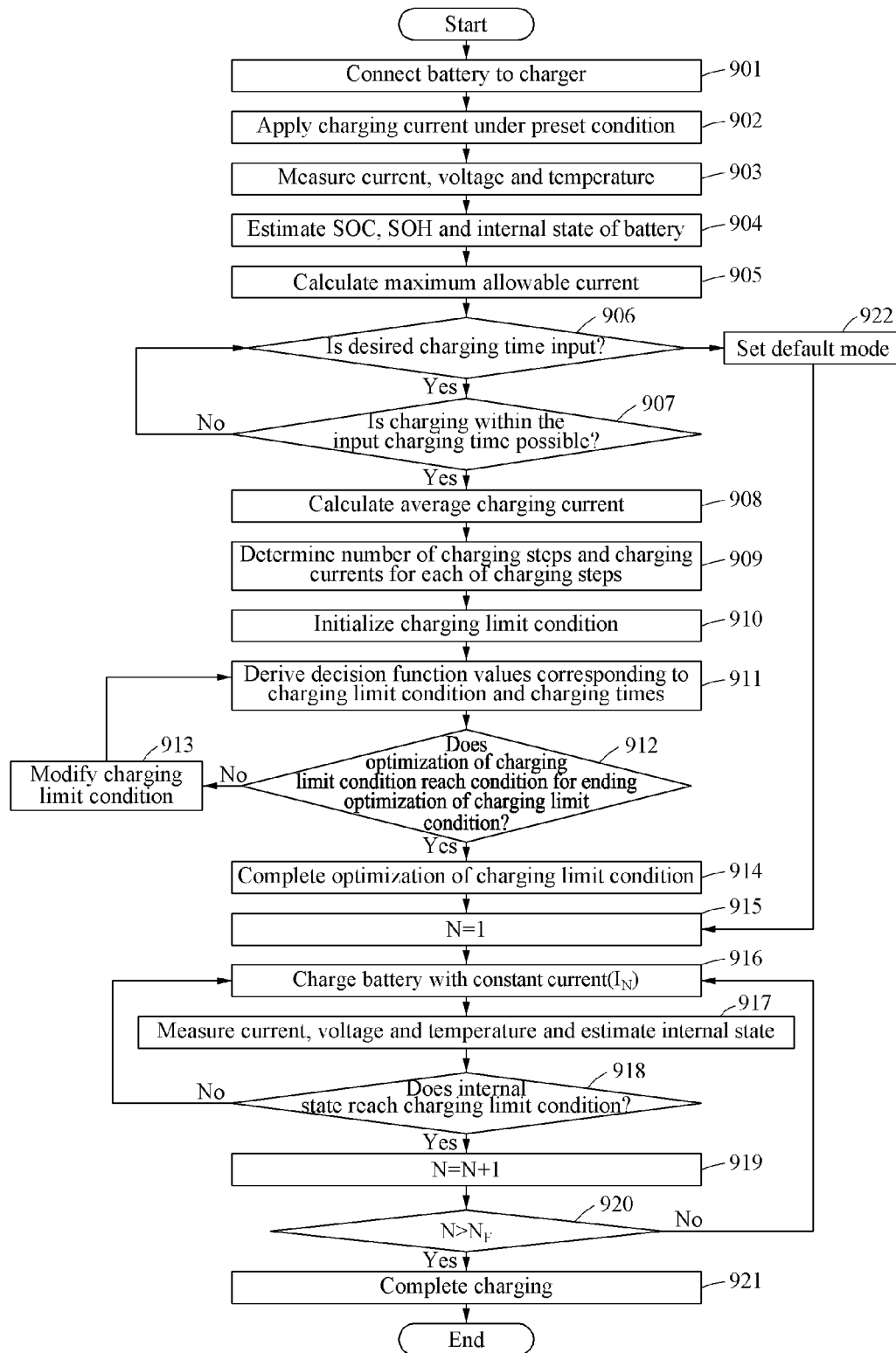
FIG. 9 is a diagram illustrating another example of a battery charging method.

FIG. 9 is a diagram illustrating another example of a battery charging method. The operations in FIG. 9 may be performed in the sequence and manner as shown, although the order of some operations may be changed or some of the operations omitted without departing from the spirit and scope of the illustrative examples described. Many of the operations shown in FIG. 9 may be performed in parallel or concurrently. One or more blocks of FIG. 9, and combinations of the blocks, can be implemented by special purpose hardware-based computer that perform the specified functions, or combinations of special purpose hardware and computer instructions. In addition to the description of FIG. 9 below, the descriptions of FIGS. 1-8 are also applicable to FIG. 9, and are incorporated herein by reference. Thus, the above description may not be repeated here.

Referring to FIG. 9, a battery is connected to a charger in operation 901, and a battery charging apparatus applies a charging current under a preset condition in operation 902. The applied charging current is, for example, a current to estimate a state of a battery. In operation 903, the battery charging apparatus estimates or measures a current, a voltage and a temperature of the battery. To estimate or measure the current, the voltage and the temperature of the battery, various schemes are used. The battery charging apparatus estimates an SOC, an SOH and an internal state of the battery in operation 904, and calculates a maximum allowable current in operation 905. For example, an electrochemical model may be utilized to estimate the SOC, the SOH and the internal state of the battery. The above description to estimate the SOC, the SOH and the internal state of the battery is applicable to operation 905, and accordingly is not repeated here.

The battery charging apparatus determines whether a desired charging time is input in operation 906. In operation 907, the battery charging apparatus determines whether charging within the input charging time is possible. For example, in operation 922, based on the result of the determination, the battery charging apparatus charges the battery in response to setting of a default mode. In an example, the default mode is an operating mode in which charging within the input charging time is not possible, and includes, for example, a slow charging mode.

In operation 908, the battery charging apparatus calculates an average charging current. In operation 910, the battery charging apparatus determines a number of charging steps and charging currents for each of the charging steps. In operation 910, the battery charging apparatus initializes a charging limit condition. In operation 911, the battery charging apparatus derives decision function values corresponding to the charging limit condition and charging times for each of the charging steps. As described above, the decision function values are function values for an optimization of the charging limit condition.

In operation 912, the battery charging apparatus determines whether an optimization of the charging limit condition reaches a condition for ending the optimization of the charging limit condition. When the optimization of the charging limit condition does not reach the condition for ending the optimization of the charging limit condition, in operation 913, the battery charging apparatus modifies the charging limit condition. For example, the battery charging apparatus determines whether the optimization of the charging limit condition ends, based on any one or any combination of a number of times values in the charging limit condition are adjusted, the amount of change of the function values, the magnitude of the function values, and a number of adjusted values. In this example, a criterion for determining whether the optimization ends is variously modified depending on design intent.

The battery charging apparatus completes the optimization of the charging limit condition in operation 914. In operation 915, the battery charging apparatus performs a charging operation based on a first charging step. The battery charging apparatus charges the battery with a constant current based on a present charging step in operation 916. In operation 917, the battery charging apparatus measures or estimates the current, the voltage, the temperature and the internal state of the battery. The battery charging apparatus determines whether the internal state reaches the charging limit condition in operation 918, and updates an index of a charging step based on a determination result in operation 919. The battery charging apparatus determines whether the present charging step is a final charging step in operation 920, and in operation 921, completes the charging of the battery based on a result of the determination.

Figure 10:
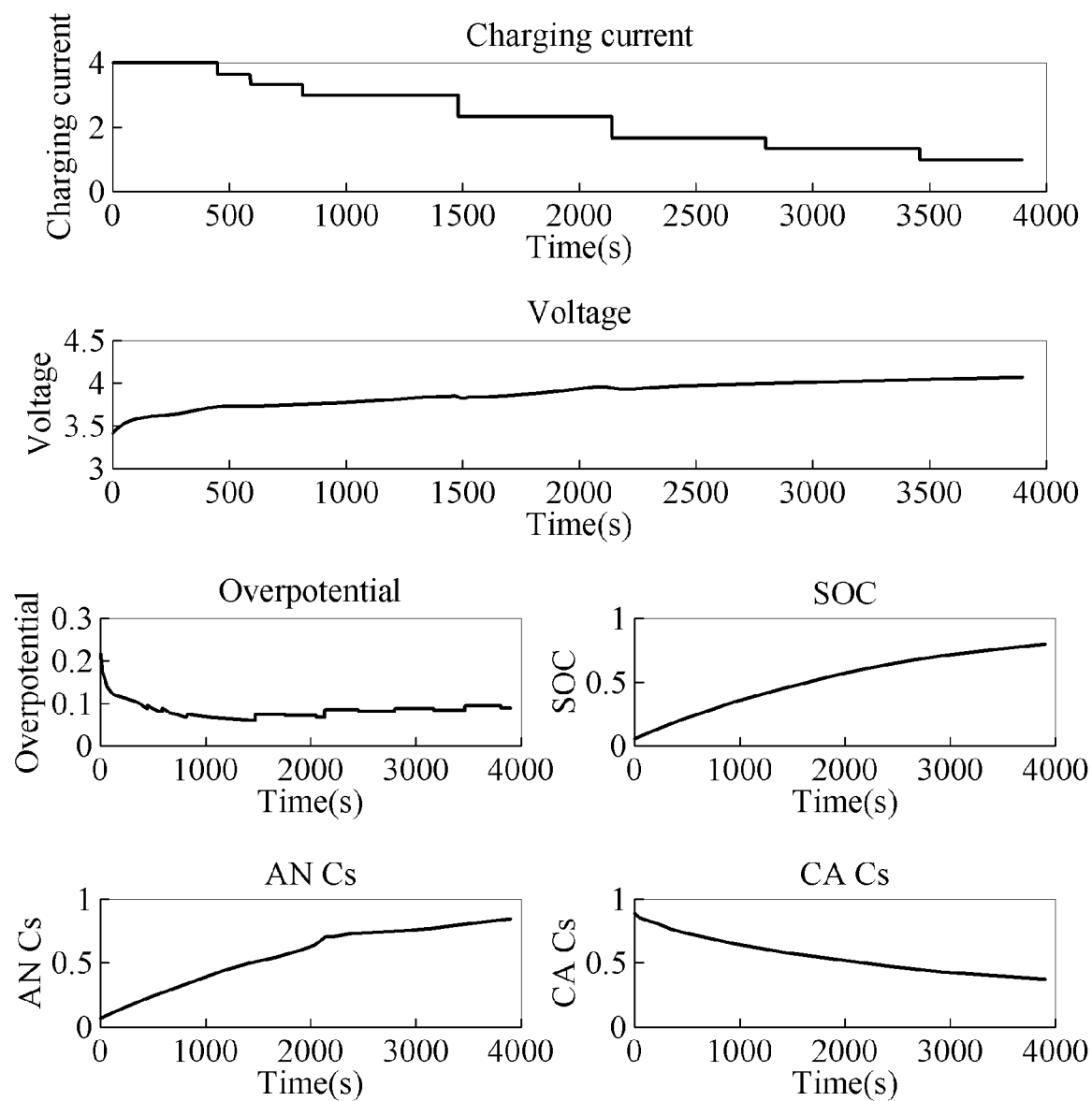
FIG. 10 illustrates an example of a charging profile and an internal state of a battery.

FIG. 10 illustrates an example of a charging profile and an internal state of a battery.

Referring to FIG. 10, a battery charging apparatus charges a battery using a charging profile based on the above-described method, and estimates an internal state of the battery based on the charging of the battery. For example, the battery charging apparatus estimates a voltage, an overpotential, an SOC, an anode lithium ion concentration and a cathode lithium ion concentration of the battery. The battery charging apparatus controls the charging of the battery based on the estimated internal state and a charging limit condition.

Figure 11:
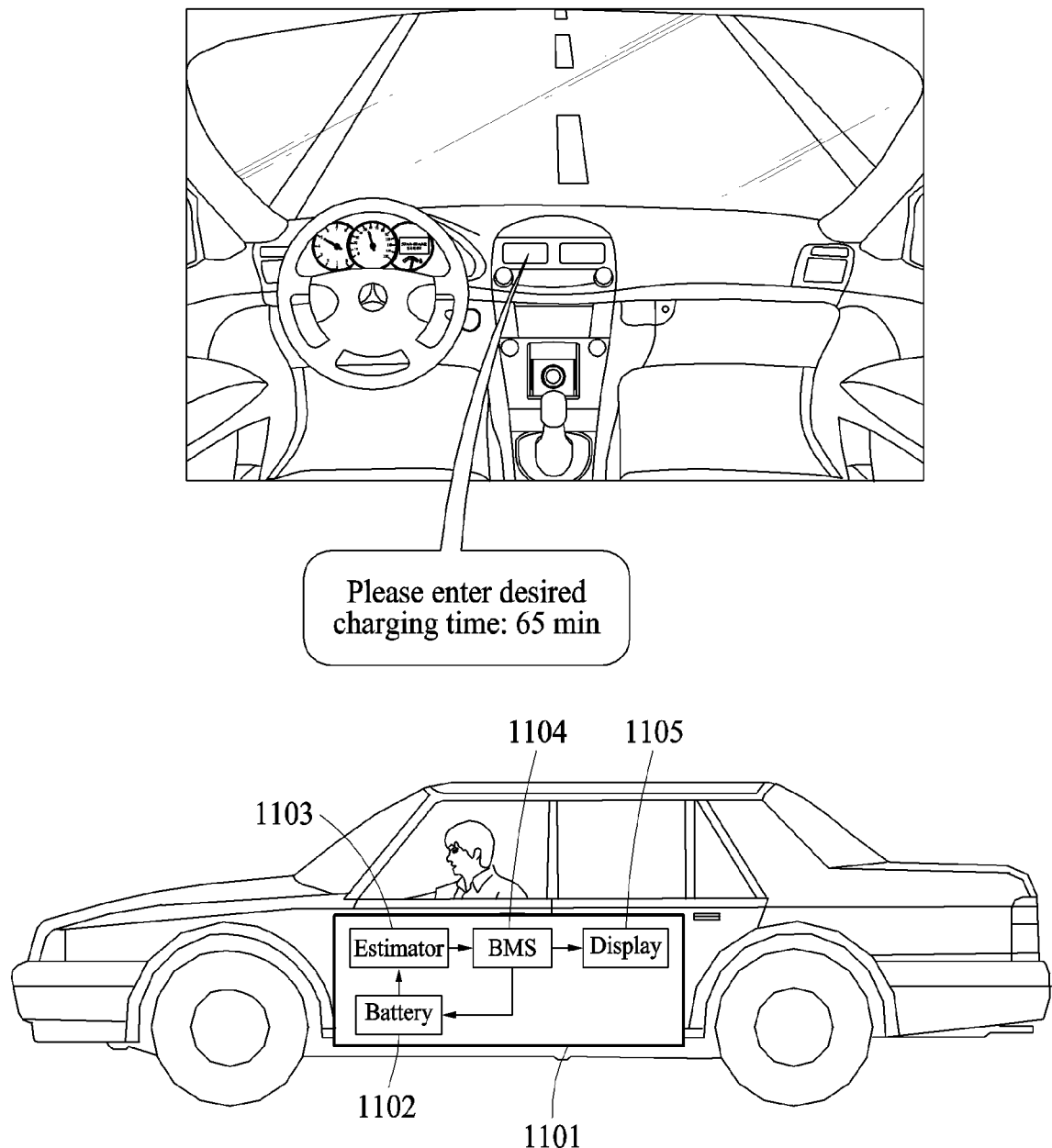
FIG. 11 illustrates an example of an operation of a battery charging apparatus.

FIG. 11 illustrates an example of an operation of a battery charging apparatus 1101.

Referring to FIG. 11, the battery charging apparatus 1101 controls charging of a battery 1102 of a vehicle. The battery charging apparatus 1101 estimates a state of the battery 1102 using an estimator 1103, and controls the charging of the battery 1102 using a BMS 1104. The battery charging apparatus 1101 provides a user interface for the charging of the battery 1102 using a display 1105. For example, the battery charging apparatus 1101 acquires a desired charging time based on an input through the user interface. The battery charging apparatus 1101 displays, using the display 1105, information associated with the charging of the battery 1102.

Figure 12:
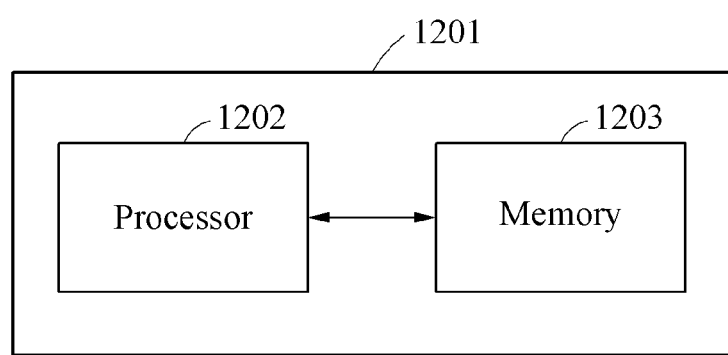
FIG. 12 is a diagram illustrating an example of a configuration of a battery charging apparatus.

FIG. 12 illustrates an example of a configuration of a battery charging apparatus 1201.

Referring to FIG. 12, the battery charging apparatus 1201 includes a processor 1202 and a memory 1203. The processor 1202 may include one or more of the apparatuses described with FIGS. 1 through 11, or may perform one or more of the methods described with FIGS. 1 through 11. The memory 1203 stores a program in which a battery charging method is implemented. The memory 1203 is, for example, a volatile memory or a nonvolatile memory. Further details regarding the processor 1202 and the memory 1203 is provided below.

The processor 1202 executes the program and controls the battery charging apparatus 1201. A code of the program executed by the processor 1202 is stored in the memory 1203. The battery charging apparatus 1201 may be connected to an external device, for example, a personal computer (PC) or a network, through an input/output (I/O) device (not shown) and may exchange data. When a charging profile generated as described above is used during charging of a battery, the battery is charged within a desired charging time. When the battery is charged based on the above-described charging profile, a life characteristic of the battery is enhanced by preventing a degradation of the battery due to fast charging of the battery.

The battery charging apparatuses 1101 and 1201 and other apparatuses, units, modules, devices, components illustrated in FIGS. 11 and 12 that perform the operations described herein with respect to FIGS. 2 and 9 are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 2 and 9 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In an example, the instructions or software includes at least one of an applet, a dynamic link library (DLL), middleware, firmware, a device driver, an application program storing the battery charging method. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processor or computer.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery charging method comprising:
receiving a desired charging time of a battery;
generating, based on the desired charging time, charging currents of respective charging steps to charge the battery;
acquiring a charging limit condition based on the desired charging time and an electrochemical model of the battery, the charging limit condition comprising at least one of an internal state condition or a maximum charging time for each of the charging steps; and
generating a charging profile based on the charging limit condition, the charging profile comprising the charging currents and charging times of the respective charging currents.

2. The battery charging method of claim 1, wherein the charging limit condition comprises a condition to prevent a degradation of the battery during charging.

3. The battery charging method of claim 1, wherein the internal state condition comprises at least one internal state, based on the electrochemical model, that has an influence on a degradation of the battery.

4. The battery charging method of claim 1, wherein the internal state condition comprises any one or any combination of an anode overpotential condition, a cathode overpotential condition, an anode surface lithium ion concentration condition, a cathode surface lithium ion concentration condition, a cell voltage condition and a state of charge (SOC) condition.

5. The battery charging method of claim 1, wherein the acquiring of the charging limit condition comprises:
initializing a charging limit condition based on the charging currents; and
optimizing the initialized charging limit condition to charge the battery during the desired charging time and to prevent a degradation of the battery, based on the electrochemical model and a degradation condition of the battery; and
the degradation condition is a condition that causes a degradation of the battery when an internal state of the battery is substantially similar to the degradation condition.

6. The battery charging method of claim 5, wherein the optimizing of the initialized charging limit condition comprises:
estimating at least one internal state for each of the charging steps of the battery to which the charging currents are applied, based on the electrochemical model; and
adjusting, based on the estimated internal state, any one or any combination of maximum charging times and internal state conditions in the initialized charging limit condition.

7. The battery charging method of claim 5, wherein the optimizing of the charging limit condition comprises:
acquiring internal state conditions in the initialized charging limit condition, and degradation conditions corresponding to the internal state conditions;
generating function values from functions to which differences between the internal state conditions and the degradation conditions are input; and
adjusting at least one of the internal state conditions based on a sum of the function values and the electrochemical model.

8. The battery charging method of claim 7, wherein
the functions are defined so that the function values decrease in response to an increase in the differences between the internal state conditions and the degradation conditions, and
the adjusting of the at least one of the internal state conditions comprises adjusting the at least one of the internal state conditions based on the electrochemical model to minimize the sum during the desired charging time.

9. The battery charging method of claim 5, wherein at least one of the degradation condition or the initialized charging limit condition is set based on a state of health (SOH) of the battery.

10. The battery charging method of claim 1, further comprising applying a degradation factor of the battery to the electrochemical model.

11. The battery charging method of claim 10, wherein the degradation factor comprises any one or any combination of an anode surface resistance, a cathode surface resistance, a reduction in an anode active material, and a reduction in a cathode active material.

12. The battery charging method of claim 1, further comprising:
estimating an state of health (SOH)of the battery;
acquiring a degradation factor of the battery based on the SOH; and
applying the degradation factor to the electrochemical model.

13. The battery charging method of claim 1, further comprising:
estimating at least one internal state of the battery; and
generating a maximum allowable current that allows the estimated internal state to reach a limit state, in response to the battery being charged until a current SOC of the battery reaches a threshold SOC,
wherein the charging currents do not exceed the maximum allowable current.

14. The battery charging method of claim 13, further comprising:
determining whether time to charge the battery is less than the desired charging time, based on the maximum allowable current and the desired charging time.

15. The battery charging method of claim 1, wherein the generating of the charging currents comprises:

generating an average charging current based on the desired charging time and a desired charging capacity of the battery; and generating a number of the charging steps and the charging currents of each of the charging steps based on the average charging current.

16. The battery charging method of claim 15, wherein the generating of the charging currents and the number of the charging steps comprise generating the charging currents and the number of the charging steps based on the average charging current and an SOH of the battery.

17. The battery charging method of claim 15, wherein the generating of the charging currents comprises generating the number of charging steps and the charging currents of the each of the charging steps based on a current range or a lookup table corresponding to the average charging current.

18. The battery charging method of claim 1, wherein the generating of the charging profile comprises:

estimating at least one internal state for each of the charging steps of the battery to which the charging currents are applied, based on the electrochemical model; and generating charging times of the charging currents based on whether the estimated internal state reaches the at least one internal state condition for the each of the charging steps in the charging limit condition.

19. The battery charging method of claim 18, wherein the generating of the charging times comprises:

determining whether a first internal state of the battery to which a first charging current of a first charging step is applied reaches a first internal state condition of the first charging step within a first maximum charging time of the first charging step;

determining a first charging time of the first charging current based on a point in time at which the first internal state reaches the first internal state condition, in response to the first internal state reaching the first internal state condition;

determining the first charging time of the first charging current based on the first maximum charging time, in response to the first internal state not reaching the first internal state condition; and generating charging times of the charging currents based on the first charging time and a second charging time of a second charging step subsequent to the first charging step.

20. The battery charging method of claim 1, further comprising:

charging the battery based on the charging profile, wherein the charging of the battery comprises:

estimating a present internal state of the battery to which a present charging current of a present charging step is applied; and applying a charging current subsequent to the present charging current to the battery based on whether the estimated present internal state reaches an internal state condition of the present charging step.

21. The battery charging method of claim 1, wherein the desired charging time of the battery comprises any one or any combination of a time value input by a user, a device-provided time, a time value received from a database, and a time value received from an external server.

22. A non-transitory computer-readable storage medium storing instructions that, when executed by a processor, cause the processor to perform the battery charging method of claim 1.

23. A battery charging method comprising:

receiving a desired charging time of a battery;

generating, based on the desired charging time, charging currents of charging steps to charge the battery;

acquiring a charging limit condition based on the desired charging time and an electrochemical model of the battery, the charging limit condition comprising an internal state condition and a maximum charging time for each of the charging steps; and charging the battery based on the charging limit condition and an internal state of the battery.

24. The battery charging method of claim 23, wherein the charging of the battery comprises:

charging the battery by applying a first charging current of a first charging step to the battery;

acquiring a current, a voltage and a temperature of the battery;

estimating at least one first internal state of the battery based on the acquired current, the acquired voltage and the acquired temperature;

determining whether the estimated first internal state reaches a first internal state condition of the first charging step; and determining whether to charge the battery with a second charging current of a second charging step, subsequent to the first charging step, based on a result of the determining.

25. The battery charging method of claim 24, wherein the charging of the battery further comprises:

determining whether a time used to charge the battery by applying the first charging current to the battery reaches a first maximum charging time of the first charging step; and determining whether the battery is to be charged with the second charging current, based on the determining of whether the time used to charge the battery reaches the first maximum charging time.

26. A battery charging apparatus comprising:

a processor configured to receive a desired charging time of a battery, to generate, based on the desired charging time, charging currents of respective charging steps to charge the battery, to acquire a charging limit condition based on the desired charging time and an electrochemical model of the battery, the charging limit condition comprising at least one of an internal state condition or a maximum charging time for each of the charging steps, and to generate a charging profile based on the charging limit condition, the charging profile comprising the charging currents and charging times for the respective charging currents.

27. A battery charging apparatus comprising:

a processor configured to receive a desired charging time of a battery, to generate, based on the desired charging time, charging currents of charging steps to charge the battery, to acquire a charging limit condition based on the desired charging time and an electrochemical model of the battery, the charging limit condition comprising an internal state condition and a maximum charging time for each of the charging steps, and to charge the battery based on the charging limit condition and an internal state of the battery.

* * * * *